United States Patent
Yamazaki et al.

(10) Patent No.: US 12,414,240 B2
(45) Date of Patent: Sep. 9, 2025

(54) CIRCUIT FORMING METHOD AND CIRCUIT FORMING DEVICE

(71) Applicant: FUJI CORPORATION, Chiryu (JP)

(72) Inventors: Kyosuke Yamazaki, Nagoya (JP); Hironori Kondo, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 421 days.

(21) Appl. No.: 17/996,292

(22) PCT Filed: Apr. 24, 2020

(86) PCT No.: PCT/JP2020/017665
§ 371 (c)(1),
(2) Date: Oct. 14, 2022

(87) PCT Pub. No.: WO2021/214973
PCT Pub. Date: Oct. 28, 2021

(65) Prior Publication Data
US 2023/0199970 A1    Jun. 22, 2023

(51) Int. Cl.
*H05K 3/10* (2006.01)
*G05B 19/4155* (2006.01)

(52) U.S. Cl.
CPC .......... *H05K 3/10* (2013.01); *G05B 19/4155* (2013.01); *G05B 2219/45026* (2013.01); *H05K 2203/163* (2013.01)

(58) Field of Classification Search
None
See application file for complete search history.

(56) References Cited

U.S. PATENT DOCUMENTS

| | | | |
|---|---|---|---|
| 2009/0114346 A1* | 5/2009 | Yashima | .......... H01L 21/67276 156/345.24 |
| 2017/0108849 A1 | 4/2017 | Kaneko | |
| 2019/0174662 A1 | 6/2019 | Ninomiya et al. | |

FOREIGN PATENT DOCUMENTS

| | | |
|---|---|---|
| EP | 1 300 059 A1 | 4/2003 |
| EP | 2 988 583 A1 | 2/2016 |
| JP | 59-32004 A | 2/1984 |
| JP | 2017-76239 A | 4/2017 |
| JP | WO 2018/008113 A1 | 1/2018 |
| WO | WO 02/01929 A1 | 1/2002 |
| WO | WO 2015/194045 A1 | 12/2015 |

OTHER PUBLICATIONS

International Search Report mailed on Jul. 21, 2020 in PCT/JP2020/017665 filed on Apr. 24, 2020 (2 pages).

* cited by examiner

*Primary Examiner* — Ryan A Jarrett
(74) *Attorney, Agent, or Firm* — Oblon, McClelland, Maier &Neustadt, L.L.P.

(57) ABSTRACT

A circuit forming method for forming a circuit with a curable resin and a conductive fluid, the method including a setting step of setting errors that occur during a circuit forming work to an automatic release error and a non-release error for each type of error, the automatic release error being to be automatically released, and the non-release error being not to be automatically released, a determination step of determining whether an error has occurred in work when the circuit is formed, and a re-execution step of automatically re-executing work determined that the error has occurred in the determination step, in a case where the error of the work is set to the automatic release error in the setting step.

4 Claims, 6 Drawing Sheets

CIRCUIT FORMING METHOD AND CIRCUIT FORMING DEVICE

TECHNICAL FIELD

The present disclosure relates to a circuit forming method for forming a circuit with a curable resin and a conductive fluid and a circuit forming device.

BACKGROUND ART

A technique for forming a circuit with a curable resin and a conductive fluid has been developed. As described above, when a circuit is formed by the curable resin and the conductive fluid, various works such as forming a resin layer with the curable resin, forming wiring with the conductive fluid, and the like are executed, and naturally, an error may occur during the work. The following Patent Literature describes a technique corresponding to various errors that have occurred during work.

PATENT LITERATURE

Patent Literature 1: JP-A-S59-032004
Patent Literature 1: JP-A-2017-076239

BRIEF SUMMARY

Technical Problem

It is an object to appropriately deal with an error that has occurred during work of forming a circuit with a curable resin and a conductive fluid.

Solution to Problem

In order to solve the above-described problems, the present specification discloses a circuit forming method for forming a circuit with a curable resin and a conductive fluid, the method including a setting step of setting errors that occur during a circuit forming work to an automatic release error and a non-release error for each type of error, the automatic release error being to be automatically released, and the non-release error being not to be automatically released, a determination step of determining whether an error has occurred in work when the circuit is formed, and a re-execution step of automatically re-executing work determined that the error has occurred in the determination step, in a case where the error of the work is set to the automatic release error in the setting step.

In order to solve the above-described problems, the present specification also discloses a circuit forming device that forms a circuit with a curable resin and a conductive fluid, the device including a setting section configured to set errors that occur during a circuit forming work to an automatic release error and a non-release error for each type of error, the automatic release error being to be automatically released, and a non-release error being not to be automatically released, a determination section configured to determine whether an error has occurred in work when the circuit is formed, and a re-execution section configured to automatically re-execute work determined that the error has occurred in the determination section, in a case where the error of the work is set to the automatic release error in the setting section.

Advantageous Effects

In the present disclosure, the errors that occur during the circuit forming work are set to the automatic release error that is automatically released and the non-release error that is not automatically released for each type of error. In a case where an error occurs, when the error is set to an automatic release error, the work corresponding to the error is automatically re-executed. As a result, it is possible to appropriately deal with the error that has occurred.

DESCRIPTION OF EMBODIMENTS

Figure 1:
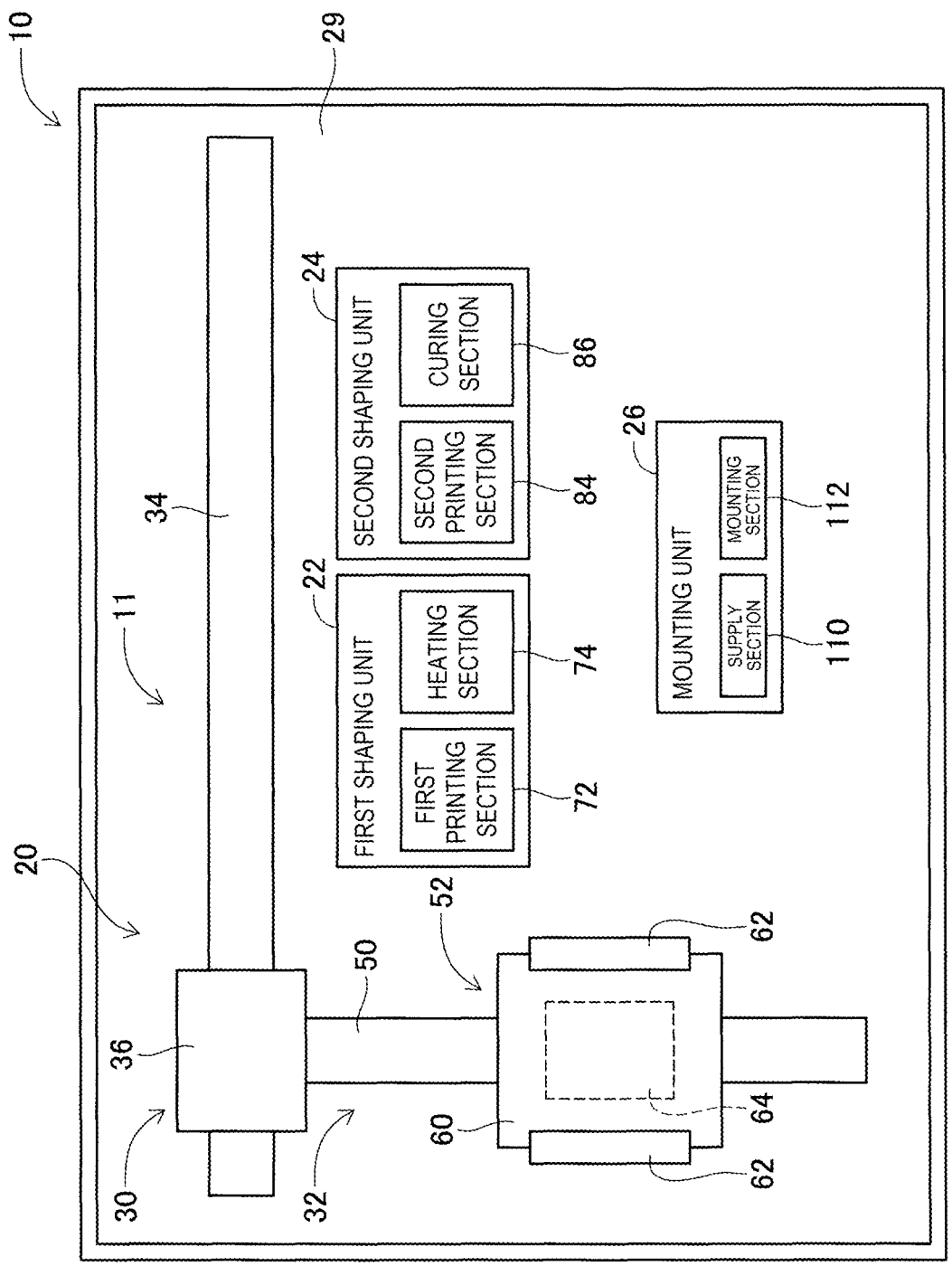
FIG. 1 is a diagram illustrating a circuit forming device.

FIG. 1 illustrates circuit forming device 10. Circuit forming device 10 is provided with conveyance device 20, first shaping unit 22, second shaping unit 24, mounting unit 26, and control device (refer to FIG. 2) 28. Conveyance device 20, first shaping unit 22, second shaping unit 24, and mounting unit 26 are disposed on base 29 of circuit forming device 10. Base 29 has a generally rectangular shape, and in the following description, a longitudinal direction of base 29 will be referred to as an X-axis direction, a lateral direction of base 29 will be referred to as a Y-axis direction, and a direction orthogonal to both the X-axis direction and the Y-axis direction will be referred to as a Z-axis direction.

Conveyance device 20 is provided with X-axis slide mechanism 30 and Y-axis slide mechanism 32. X-axis slide mechanism 30 includes X-axis slide rail 34 and X-axis slider 36. X-axis slide rail 34 is disposed on base 29 to extend in the X-axis direction. X-axis slider 36 is held by X-axis slide rail 34 to be slidable in the X-axis direction. Furthermore, X-axis slide mechanism 30 includes electromagnetic motor (refer to FIG. 2) 38, and moves X-axis slider 36 to any position in the X-axis direction by driving electromagnetic motor 38. In addition, Y-axis slide mechanism 32 includes Y-axis slide rail 50 and stage 52. Y-axis slide rail 50 is disposed on base 29 to extend in the Y-axis direction and is movable in the X-axis direction. A first end portion of Y-axis slide rail 50 is connected to X-axis slider 36. Stage 52 is held on Y-axis slide rail 50 to be slidable in the Y-axis direction. Furthermore, Y-axis slide mechanism 32 has electromagnetic motor (refer to FIG. 2) 56, and stage 52 moves to any position in the Y-axis direction by driving electromagnetic motor 56. As a result, stage 52 is moved to any position on base 29 by driving X-axis slide mechanism 30 and Y-axis slide mechanism 32. An encoder is incorporated in electromagnetic motors 38 and 56, and stage 52 moves to any position on base 29 by controlling the operations of electromagnetic motors 38 and 56 based on an output value of the encoder.

Stage 52 includes base plate 60, holding devices 62, and lifting and lowering device 64. Base plate 60 is formed in a flat plate shape, and a board is placed on the upper surface of base plate 60. Holding devices 62 are provided on both side portions of base plate 60 in the X-axis direction. The board is fixedly held by interposing both edge portions of the board placed on base plate 60 in the X-axis direction with holding device 62. In addition, lifting and lowering device 64 is disposed below base plate 60, and lifts and lowers base plate 60.

First shaping unit 22 is a unit for shaping wirings of a circuit board, and includes first printing section 72 and heating section 74. First printing section 72 includes ink jet head 76 (refer to FIG. 2). Ink jet head 76 discharges metallic ink. The metallic ink is a liquid in which nanometer-sized metal fine particles are dispersed in a solvent. Therefore, in ink jet head 76, the metallic ink is heated in order to appropriately discharge the metallic ink, and the temperature of the metallic ink is detected by temperature sensor 77 (refer to FIG. 2). As a result, in ink jet head 76, the temperature of the metallic ink is controlled based on a detected value of temperature sensor 77, and the viscosity of the metallic ink suitable for discharge is secured. Surfaces of the metal fine particles are coated with a dispersant and aggregation in the solvent is prevented. In addition, ink jet head 76 discharges the metallic ink from multiple nozzles by, for example, a piezo method using a piezoelectric element.

Figure 2:
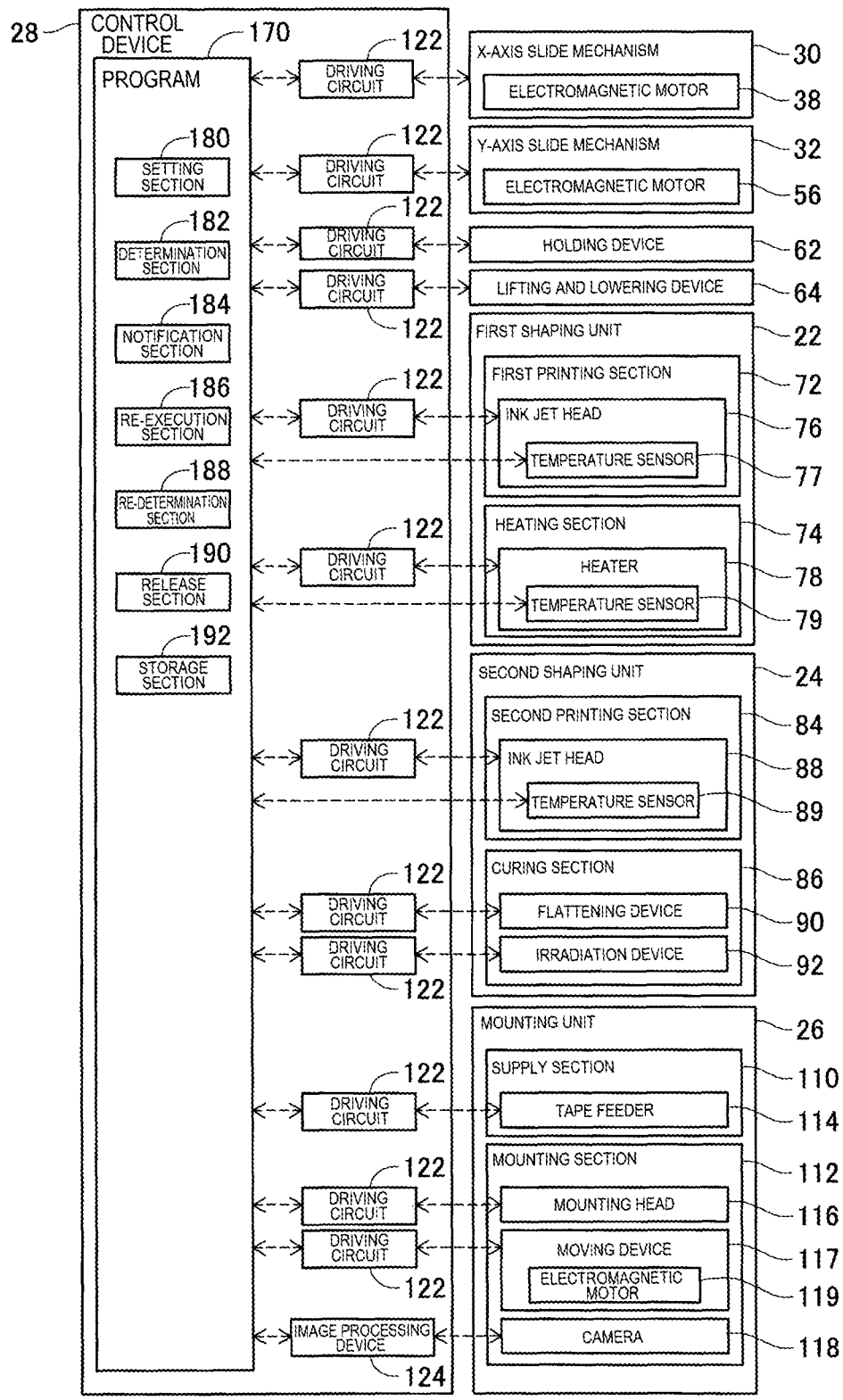
FIG. 2 is a block diagram illustrating a control device.

Heating section 74 has heater 78 (refer to FIG. 2). Heater 78 is a device for heating the metallic ink discharged by ink jet head 76. The metallic ink is fired by being heated by heater 78 so that wiring is formed. Firing of the metallic ink is a phenomenon in which energy is applied so as to vaporize the solvent and decompose a protective film of the metal fine particle, that is, the dispersant, and the metal fine particles are contacted or fused with each other, and thus conductivity is increased. The metallic ink is fired to form metal wiring. In addition, temperature sensor 79 (refer to FIG. 2) is built in heater 78, and the temperature of heater 78 is controlled based on a detected value of temperature sensor 79.

Second shaping unit 24 is a unit for shaping a resin layer of a circuit board, and includes second printing section 84 and curing section 86. Second printing section 84 includes ink jet head 88 (refer to FIG. 2). Ink jet head 88 discharges an ultraviolet curable resin. The ultraviolet curable resin is a resin cured by irradiation with ultraviolet rays and is in a liquid state. Therefore, in ink jet head 88, the ultraviolet curable resin is heated in order to appropriately discharge the ultraviolet curable resin, and the temperature of the ultraviolet curable resin is detected by temperature sensor 89 (refer to FIG. 2). As a result, in ink jet head 88, the temperature of the ultraviolet curable resin is controlled based on a detected value of temperature sensor 89, and the viscosity of the ultraviolet curable resin suitable for discharge is secured. Ink jet head 88 may be, for example, a piezo type ink jet head using a piezoelectric element, or may be a thermal type ink jet head in which a resin is heated to generate air bubbles, which are discharged from multiple nozzles.

Curing section 86 includes flattening device (refer to FIG. 2) 90 and irradiation device (refer to FIG. 2) 92. Flattening device 90 flattens the upper surface of the ultraviolet curable resin discharged by ink jet head 88, and for example, scrapes up excess resin by a roller or a blade while smoothening the surface of the ultraviolet curable resin, to make the thickness of the ultraviolet curable resin uniform. In addition, irradiation device 92 is provided with a mercury lamp or LED as a light source, and irradiates the discharged ultraviolet curable resin with ultraviolet rays. As a result, the discharged ultraviolet curable resin is cured to form the resin layer.

Mounting unit 26 is a unit for mounting the electronic component on a circuit board, and includes supply section 110 and mounting section 112. Supply section 110 has multiple tape feeders (refer to FIG. 2) 114 that feed the taped electronic components one by one, and supplies the electronic component at a supply position. Supply section 110 is not limited to tape feeder 114, and may be a tray-type supply device that supplies the electronic component by picking up the electronic component from a tray. In addition, supply section 110 may be configured to include both the tape-type and the tray-type, or another type of supply device.

Mounting section 112 includes mounting head (refer to FIG. 2) 116, moving device (refer to FIG. 2) 117, and camera (refer to FIG. 2) 118. Mounting head 116 has a suction nozzle (not illustrated) for picking up and holding the electronic component. The suction nozzle picks up and holds the electronic component by suctioning air when negative pressure is supplied from a positive and negative pressure supply device (not illustrated). The electronic component is separated by supplying a slight positive pressure from the positive and negative pressure supply device. The suction nozzle is detachable from mounting head 116, and can be exchanged with a suction nozzle having a predetermined size accommodated in a nozzle tray (not illustrated). As a result, by mounting the suction nozzle having a size corresponding to the electronic component as a holding target on mounting head 116, the electronic component can be appropriately held. In addition, moving device 117 moves mounting head 116 by driving electromagnetic motor 119 (refer to FIG. 2). An encoder is incorporated in electromagnetic motor 119, and moving device 117 moves mounting head 116 to any position by controlling the operation of electromagnetic motor 119 based on the output value of the encoder. As a result, mounting head 116 moves between the supply position of the electronic component by tape feeder 114 and base plate 60. With such a structure, in mounting section 112, the electronic component supplied from tape feeder 114 is held by the suction nozzle, and the electronic component held by the suction nozzle is mounted on the circuit board. In addition, camera 118 images the suction nozzle mounted on mounting head 116. As a result, it is possible to determine the posture of the component held by the suction nozzle, and whether the suction nozzle is mounted on mounting head 116 based on the image data.

As illustrated in FIG. 2, control device 28 is provided with controller 120, multiple drive circuits 122, and image processing device 124. Multiple drive circuits 122 are connected to electromagnetic motors 38 and 56, holding device 62, lifting and lowering device 64, ink jet head 76, heater 78, ink jet head 88, flattening device 90, irradiation device 92, tape feeder 114, mounting head 116, and electromagnetic motor 119. Controller 120 is provided with CPU ROM, RAM, and the like, is mainly a computer, and is connected to multiple drive circuits 122. As a result, the operations of conveyance device 20, first shaping unit 22, second shaping unit 24, and mounting unit 26 are controlled by controller 120. In addition, controller 120 is also connected to image processing device 124. Image processing device 124 is for processing the image data obtained by camera 118, and controller 120 acquires various types of information from the image data. Furthermore, controller 120 is also connected to temperature sensor 77 of ink jet head 76, temperature sensor 79 of heater 78, and temperature sensor 89 of ink jet head 88. As a result, controller 120 acquires the detected values of temperature sensors 77, 79, and 89.

In circuit forming device 10, the resin laminate is formed on the board by the above-described configuration, the electronic component is mounted on the resin laminate, and the wiring is formed so as to energize the electronic component to form a circuit.

Figure 3:
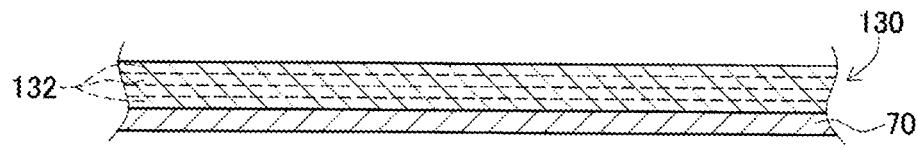
FIG. 3 is a cross-sectional view illustrating a circuit in a state where a resin laminate is formed.

Specifically, board 70 (refer to FIG. 3) is set on base plate 60 of stage 52, and stage 52 is moved below second shaping unit 24. In second shaping unit 24, resin laminate 130 is formed on board 70 as illustrated in FIG. 3. Resin laminate 130 is formed by repeating discharge of the ultraviolet curable resin from ink jet head 88 and irradiation of the discharged ultraviolet curable resin with ultraviolet rays by irradiation device 92.

More specifically, in second printing section 84 of second shaping unit 24, ink jet head 88 discharges the ultraviolet curable resin in a thin film shape onto an upper surface of board 70. Subsequently, when the ultraviolet curable resin is discharged in a thin film shape, the ultraviolet curable resin is flattened by flattening device 90 in curing section 86, so that the ultraviolet curable resin has a uniform film thickness. Irradiation device 92 irradiates the thin film-shaped ultraviolet curable resin with ultraviolet rays. As a result, thin film-shaped resin layer 132 is formed on board 70.

Subsequently, ink jet head 88 discharges the ultraviolet curable resin in a thin film shape onto thin film-shaped resin layer 132. The thin film-shaped ultraviolet curable resin is flattened by flattening device 90, irradiation device 92 irradiates the ultraviolet curable resin discharged in a thin film shape with ultraviolet rays, and thus thin film-shaped resin layer 132 is laminated on thin film-shaped resin layer 132. As described above, the discharge of the ultraviolet curable resin onto thin film-shaped resin layer 132 and the irradiation with ultraviolet rays are repeated, and multiple resin layers 132 are laminated, and thus resin laminate 130 is formed.

Figure 4:
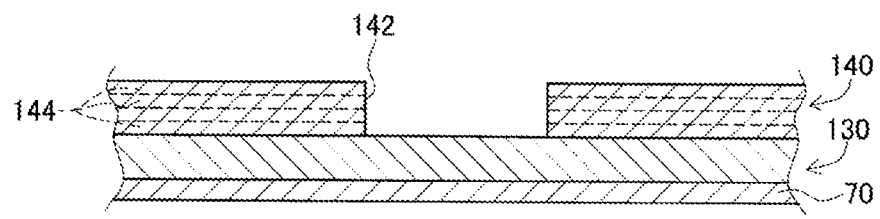
FIG. 4 is a cross-sectional view illustrating a circuit in a state where a resin laminate is further formed on a resin laminate.

Next, as illustrated in FIG. 4, resin laminate 140 is further formed on resin laminate 130. Resin laminate 140 has cavity 142 and is prepared by substantially the same method as resin laminate 130. In other words, in second printing section 84 of second shaping unit 24, ink jet head 88 discharges the ultraviolet curable resin in a thin film shape on the upper surface of resin laminate 130. At this time, ink jet head 88 discharges the ultraviolet curable resin so that a predetermined portion of the upper surface of resin laminate 130 is exposed in a generally rectangular shape. Subsequently, when the ultraviolet curable resin is discharged in a thin film shape, the ultraviolet curable resin discharged in a thin film shape is flattened by flattening device 90 in curing section 86, and ultraviolet rays are irradiated by irradiation device 92. As a result, thin film-shaped resin layer 144 is formed on resin laminate 130.

Subsequently, ink jet head 88 discharges the ultraviolet curable resin in a thin film shape only on a portion of thin film-shaped resin layer 144. The ultraviolet curable resin discharged in a thin film shape is flattened by flattening device 90, and resin layer 144 in a thin film shape is laminated on resin layer 144 in a thin film shape by irradiating with ultraviolet rays by irradiation device 92. As described above, the discharge of the ultraviolet curable resin onto thin film-shaped resin layer 144 excluding the generally rectangular portion of the upper surface of resin laminate 130 and the irradiation of the ultraviolet rays are repeated, and multiple resin layers 144 are laminated, and thus resin laminate 140 having cavity 142 is formed.

Figure 5:
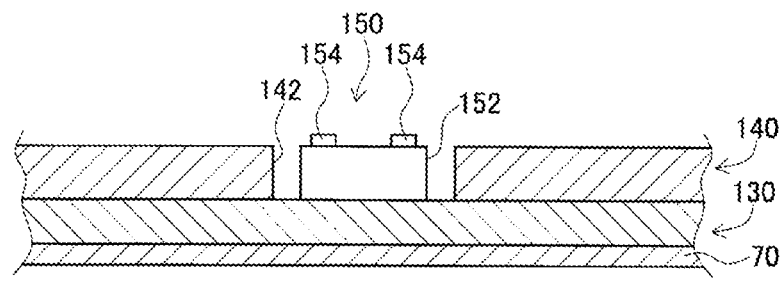
FIG. 5 is a cross-sectional view illustrating a circuit in a state where an electronic component is mounted inside a cavity of the resin laminate.

When resin laminate 140 having cavity 142 is formed, stage 52 is moved below mounting unit 26. In mounting unit 26, the electronic component is supplied by tape feeder 114, and the electronic component is held by the suction nozzle of mounting head 116. As illustrated in FIG. 5, electronic component 150 is configured to include generally block-shaped component main body 152 and a pair of electrodes 154 disposed on one surface of component main body 152. Electronic component 150 is held by the suction nozzle in a posture in which the pair of electrodes is directed upward. In addition, the suction nozzle holding electronic component 150 is imaged by camera 118, and the holding posture of electronic component 150 by the suction nozzle is calculated based on the image data. Mounting head 116 is moved by moving device 117, and electronic component 150 held by the suction nozzle is mounted on the upper surface of resin laminate 130 inside cavity 142 of resin laminate 140, as illustrated in FIG. 5. At this time, the mounting position of electronic component 150 is corrected using the holding posture of electronic component 150 calculated based on the image data, and electronic component 150 is mounted inside cavity 142. The depth dimension of cavity 142 of resin laminate 140 is substantially the same as the height dimension of component main body 152 of electronic component 150. Therefore, the height of the upper surface of component main body 152 of electronic component 150 mounted inside cavity 142 is substantially the same as the height of the upper surface of resin laminate 140.

Figure 6:
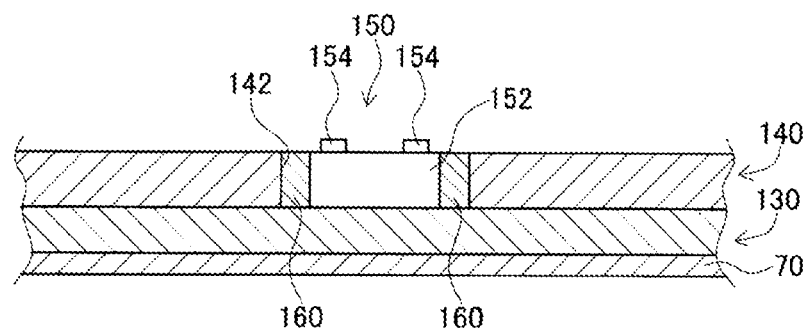
FIG. 6 is a cross-sectional view illustrating a circuit in a state where a resin laminate is sealed inside a cavity.

Next, stage 52 is moved below second shaping unit 24. In second shaping unit 24, as illustrated in FIG. 6, resin laminate 160 is formed between a gap between cavity 142 of resin laminate 140, that is, a side surface of component main body 152 of electronic component 150, and an inner wall surface that defines cavity 142 of resin laminate 140. At this time, resin laminate 160 is formed so that the upper surface of resin laminate 160 and the upper surface of resin laminate 140 are flat, that is, flush. As a result, the upper surface of resin laminate 140, the upper surface of resin laminate 160, and the upper surface of component main body 152 of electronic component 150 are flush with each other. Resin laminate 160 is formed by repeating the discharge of the ultraviolet curable resin by ink jet head 88 and the irradiation of the ultraviolet rays by irradiation device 92, similarly to resin laminate 130.

Figure 7:
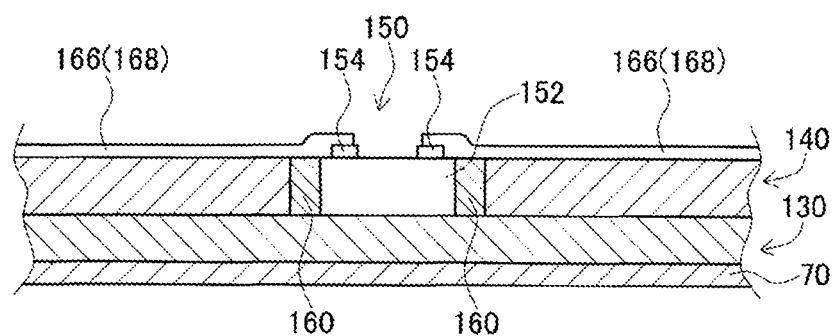
FIG. 7 is a cross-sectional view illustrating a circuit in a state where wiring conductive with an electronic component is formed.

Subsequently, stage 52 is moved below first shaping unit 22. In first printing section 72 of first shaping unit 22, the metallic ink is linearly discharged by ink jet head 76 onto resin laminates 140 and 160 in accordance with the circuit pattern. At this time, as illustrated in FIG. 7, metallic ink 166 is linearly discharged so as to connect electrode 154 of electronic component 150 and the electrode of another electronic component (not illustrated). In heating section 74 of first shaping unit 22, metallic ink 166 is heated by heater 78. As a result, metallic ink 166 is fired to form wiring 168. In other words, wiring 168 conductive with electrode 154 of electronic component 150 is formed.

As described above, in circuit forming device 10, resin laminates 130, 140, and 160 are formed of the ultraviolet curable resin, electronic component 150 is mounted, and wiring 168 that energizes the electronic component is formed of metallic ink 166, so that the circuit can be formed. However, in a case where a circuit is formed according to the above method, since it takes a significantly long time to form multiple resin layers 132, to fire metallic ink 166, and the like, the time required to form the circuit is several hours to 10 hours or more. Therefore, the worker operates circuit forming device 10 before returning home, and the circuit is formed by circuit forming device 10 outside working hours of the worker, for example, at night. As a result, the worker can obtain a completed circuit the next morning after circuit forming device 10 is operated.

However, when the circuit is formed by circuit forming device 10, an error may occur in the work by circuit forming device 10, and circuit forming device 10 may stop. In such a case, when the worker is absent outside working hours, for example, at night, circuit forming device 10 is stopped until the following morning, so that circuit forming device 10 is left in a stopped state for a long time. In addition, even in a case where the stop of circuit forming device 10 is notified to the worker using a remote notification system or the like, it is a heavy burden on the worker that the worker releases the error and restarts the operation of circuit forming device 10 outside working hours.

In view of this situation, in circuit forming device 10, it is determined whether an error has occurred in the work when the circuit is formed, and the work determined that the error has occurred is automatically re-executed. However, when the work is re-executed for all the errors that have occurred when the circuit is formed, there is a possibility that an appropriate circuit cannot be formed. In addition, according to the extent of the error that has occurred, the worker may want to judge whether to re-execute the work in which the error has occurred or to discard a circuit being formed. Therefore, in circuit forming device 10, the errors that occur when the circuit is formed are set to an automatic release error that is automatically released and a non-release error that is not automatically released for each type of error. In a case where an error of work determined that an error has occurred is set to the automatic release error, the work is automatically re-executed.

Figure 8:
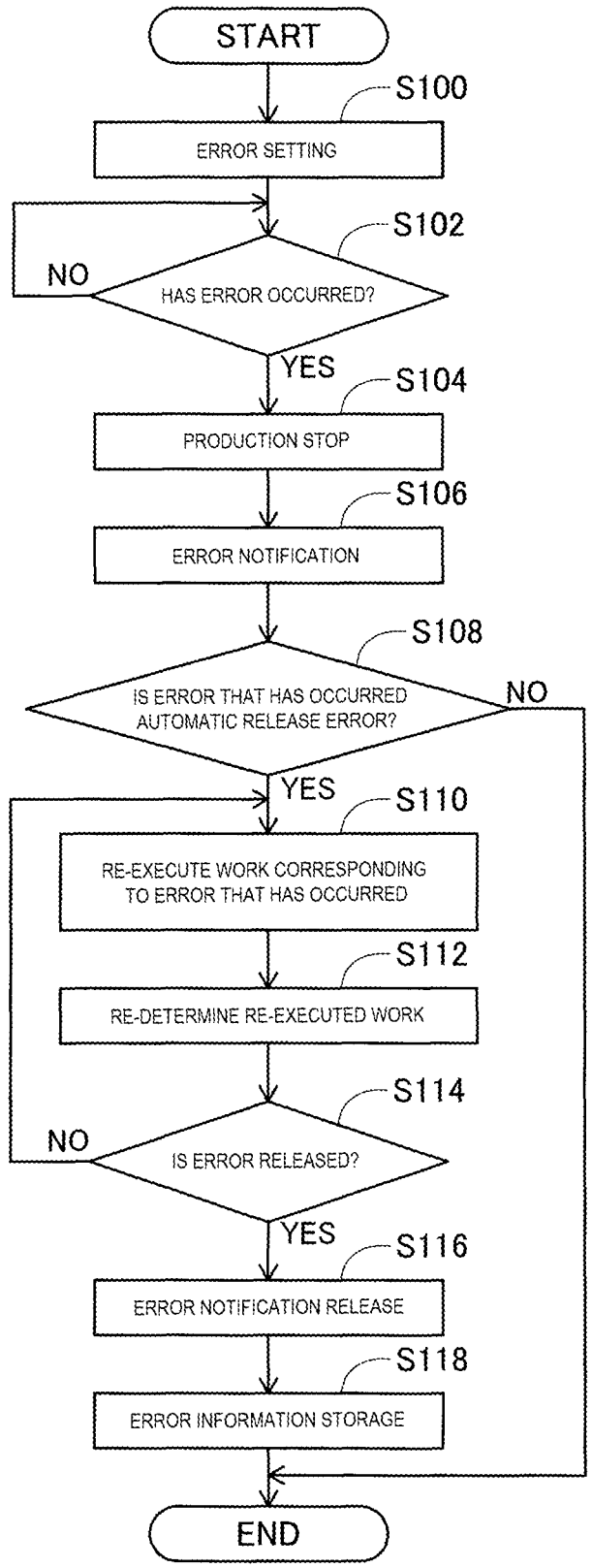
FIG. 8 illustrates a flowchart executed by a program.
Figure 9:
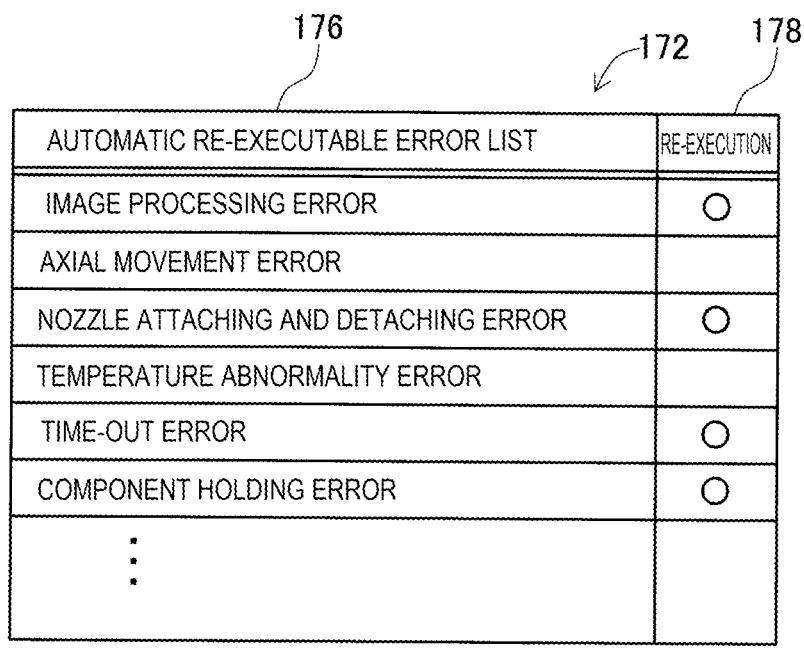
FIG. 9 illustrates an error setting screen.

Specifically, program 170 (refer to FIG. 2) is incorporated in controller 120, and the flowchart illustrated in FIG. 8 is executed by the processing of program 170. At this time, first, a setting of the automatic release error and the non-release error is executed (S100). Specifically, error setting screen 172 illustrated in FIG. 9 is displayed on a display device (not illustrated) of circuit forming device 10. On error setting screen 172, a list of errors in which the work corresponding to the error that has occurred can be automatically re-executed (hereinafter, referred to as an "automatic re-executable error list") 176 is displayed. The automatic re-executable error list includes only an error of work that can be automatically re-executed by circuit forming device 10, and does not include an error of work that cannot be automatically re-executed by circuit forming device 10. Incidentally, the error of the work that cannot be automatically re-executed by circuit forming device 10 is, for example, an error due to the shortage of consumables such as ultraviolet curable resin and metallic ink.

On the other hand, the errors of the work that can be automatically re-executed by circuit forming device 10 include an image processing error, an axial movement error, a nozzle attaching and detaching error, a temperature abnormality error, a time-out error, a component holding error, and the like. The image processing error is an error that occurs during image processing of the image data imaged by camera 118, and occurs, for example, in a case where the posture or the like of electronic component 150 held by the suction nozzle cannot be recognized based on the image data. The axial movement error is an error that occurs when stage 52 moves, when mounting head 116 moves, or the like, and occurs, for example, in a case where stage 52, mounting head 116, or the like do not move to any position. The nozzle attaching and detaching error is an error that occurs when the suction nozzle mounted on mounting head 116 is exchanged, and occurs, for example, in a case where the suction nozzle mounted on mounting head 116 is not detached from mounting head 116 when the suction nozzle is released. The temperature abnormality error is an error that occurs when heater 78 is heated, and occurs, for example, in a case where heater 78 is not heated to a set temperature range, or is heated beyond the set temperature range. In addition, the temperature abnormality error is also an error that occurs when the ultraviolet curable resin or the metallic ink is heated in ink jet heads 76 and 88, and occurs, for example, in a case where the ultraviolet curable resin or the metallic ink is not heated to a set temperature range, or is heated beyond the set temperature range. The time-out error is an error that occurs during work by flattening device 90 or the like, and occurs, for example, in a case where work by flattening device 90 is not completed within a set time. The component holding error is an error that occurs when electronic component 150 is mounted by the suction nozzle, and occurs, for example, in a case where the suction nozzle cannot hold electronic component 150 supplied by tape feeder 114.

As described above, in error setting screen 172, multiple types of errors are displayed in automatic re-executable error list 176, and input field 178 is displayed for each type of error. When the worker operates input field 178, a circle is displayed in operated input field 178. At this time, an error corresponding to input field 178 in which a circle is displayed is set as an automatic release error. On the other hand, an error corresponding to input field 178 in which a circle is not displayed is set to a non-release error. In error setting screen 172 illustrated in FIG. 9, the image processing error, the nozzle attaching and detaching error, the time-out error, and the component holding error are set to the automatic release error, and the axial movement error and the temperature abnormality error are set to the non-release error. This is because the worker sets the axial movement error to the non-release error in consideration of the possibility that the discharge of the ultraviolet curable resin, the mounting of electronic component 150, or the like cannot be appropriately executed in a case where stage 52, mounting head 116, or the like do not move to any position when the circuit is formed. In addition, this is because the worker sets the temperature abnormality error to the non-release error in consideration of the possibility that the firing of the metallic ink, the discharge of the ultraviolet curable resin, or the like cannot be appropriately executed in a case where heater 78 is not heated to the set temperature range or the ultraviolet curable resin or the metallic ink is not heated to the set temperature range.

As described above, when the automatic release error and the non-release error are set in error setting screen 172, it is determined whether an error has occurred in the work in circuit forming device 10 (S102). Specifically, when the suction nozzle holding electronic component 150 is imaged by camera 118, the holding posture of electronic component 150 by the suction nozzle is calculated based on the image data. At this time, it is determined whether the holding posture of electronic component 150 by the suction nozzle can be calculated based on the image data. In a case where the holding posture of electronic component 150 cannot be calculated based on the image data, it is determined that an error has occurred in the image processing work.

When stage 52 moves by the operation of conveyance device 20, or when mounting head 116 moves by the operation of moving device 117, conveyance device 20, or moving device 117 operates in accordance with a command from controller 120. As a result, stage 52 or mounting head 116 moves to a position corresponding to the command from controller 120 (hereinafter, referred to as a "command position"). At this time, the position after stage 52 or mounting head 116 has moved (hereinafter, referred to as a "post-movement position") is calculated based on the output value of the encoder such as electromagnetic motors 38 of conveyance device 20. It is determined whether the post-movement position is within a set range centered on the command position, for example, within a range of 0.1 mm. In a case where the post-movement position is not within the set range centered on the command position, it is determined that an error has occurred in the moving work of stage 52 or mounting head 116.

In addition, when the suction nozzle mounted on mounting head 116 is exchanged, first, the suction nozzle mounted on mounting head 116 is accommodated in the nozzle tray, and another suction nozzle accommodated in the nozzle tray is mounted on mounting head 116. At this time, after the accommodation work of the suction nozzle mounted on mounting head 116 in the nozzle tray is executed, mounting head 116 is imaged, and the presence or absence of the suction nozzle is determined based on the image data. In a case where it is determined that there is a suction nozzle based on the image data, it is determined that an error has occurred in the accommodation work of the suction nozzle in the nozzle tray. In addition, after the mounting work of the suction nozzle accommodated in the nozzle tray on mounting head 116 is executed, mounting head 116 is imaged, and the presence or absence of the suction nozzle is determined based on the image data. In a case where it is determined that there are no suction nozzles based on the image data, it is determined that an error has occurred in the mounting work of the suction nozzles on mounting head 116.

When the metallic ink is heated by heater 78, the temperature of heater 78 is controlled based on the detected value of temperature sensor 79. At this time, in a case where the temperature of heater 78 is out of the set temperature range, for example, 100° C. to 105° C., it is determined that an error has occurred in a temperature raising work of heater 78. In addition, when the ultraviolet curable resin and the metallic ink are discharged by ink jet heads 76 and 88, the ultraviolet curable resin and the metallic ink are heated, and the temperatures of the ultraviolet curable resin and the metallic ink are controlled based on the detected values of temperature sensors 77 and 89. At this time, in a case where the temperature of the ultraviolet curable resin is out of the set temperature range, for example, 70° C. to 75° C., it is determined that an error has occurred in the temperature raising work of the ultraviolet curable resin. In addition, in a case where the temperature of the metallic ink is out of the set temperature range, for example, 30° C. to 35° C., it is determined that an error has occurred in the temperature raising work of the metallic ink.

When the ultraviolet curable resin is flattened by flattening device 90, the time required for the flattening work of the ultraviolet curable resin by flattening device 90 is measured. At this time, in a case where the time until the flattening work of the ultraviolet curable resin by flattening device 90 is completed exceeds a set time, for example, 10 seconds, it is determined that an error has occurred in the flattening work by flattening device 90.

When the holding work of electronic component 150 by the suction nozzle is executed, the suction nozzle is imaged by camera 118. At this time, in a case where the presence or absence of electronic component 150 is determined based on the image data, and it is determined that there is no electronic component 150 based on the image data, it is determined that an error has occurred in the holding work of electronic component 150 by the suction nozzle.

As described above, when various works are executed in circuit forming device 10, it is determined whether an error has occurred in the executed work. At this time, in a case where it is determined that an error has occurred (S102: YES), the production by circuit forming device 10 is stopped (S104). The occurrence of an error is notified by lighting a warning lamp, generating a warning sound, displaying a warning screen, or the like (S106). Subsequently, it is determined whether the error that has occurred is set to the automatic release error (S108). In other words, it is determined whether the error that has occurred is set to the automatic release error by the user operation on error setting screen 172.

In a case where the generated error is set to the automatic release error (S108: YES), the work corresponding to the error that has occurred is re-executed (S110). That is, for example, in a case where an error occurs during an image processing work, as illustrated in FIG. 9, when the image processing error is set to the automatic release error, the suction nozzle is imaged again by camera 118. The imaging conditions when the suction nozzle is imaged again are the same as the imaging conditions when imaging caused the generated image processing error. In addition, in a case where an error occurs during the exchange operation of the nozzle, that is, during the work for attaching and detaching the suction nozzle to and from mounting head 116, when the nozzle attaching and detaching error is set to the automatic release error, the attaching and detaching work of the suction nozzle to and from mounting head 116 is executed again. In addition, in a case where an error occurs during the flattening work of the ultraviolet curable resin by flattening device 90, when the time-out error is set to the automatic release error, the flattening work of the ultraviolet curable resin by flattening device 90 is executed again. In addition, in a case where an error occurs during the holding work of electronic component 150 by the suction nozzle, when the component holding error is set to the automatic release error, the holding work of electronic component 150 by the suction nozzle is executed again.

The axial movement error is not set to the automatic release error in error setting screen 172 illustrated in FIG. 9, but in a case where an error occurs during the movement of stage 52 or the like, when the axial movement error is set to the automatic release error, stage 52 or the like moves again toward the command position by the operation of conveyance device 20. In addition, the temperature abnormality error is not set to the automatic release error in error setting screen 172 illustrated in FIG. 9, but in a case where an error occurs during the heating of heater 78, when the temperature abnormality error is set to the automatic release error, heater 78 is heated again. In addition, in a case where an error occurs when heating the ultraviolet curable resin or the like in ink jet heads 76 and 88, when the temperature abnormality error is set to the automatic release error, the ultraviolet curable resin or the like is heated again in ink jet heads 76 and 88.

When the work corresponding to the error that has occurred is re-executed, it is re-determined whether an error has occurred for the re-executed work (S112). That is, for example, when the suction nozzle is imaged again by camera 118 in response to an image processing error, the holding posture of electronic component 150 held by the suction nozzle is calculated based on the image data. At this time, when the holding posture of electronic component 150 is calculated based on the image data, it is determined that the image processing error is released (S114: YES). In addition, when the work for attaching and detaching the suction nozzle to and from mounting head 116 is executed again in response to the nozzle attaching and detaching error, mounting head 116 is imaged by camera 118, and the presence or absence of the suction nozzle is determined based on the image data. At this time, when it is determined that there is no suction nozzle based on the image data in the detaching work of the suction nozzle from mounting head 116, it is determined that the nozzle attaching and detaching error is released (S114: YES). In addition, in the mounting work of the suction nozzle on mounting head 116, when it is determined that there is a suction nozzle based on the image data, it is determined that the nozzle attaching and detaching error is released (S114: YES). In addition, when the suction nozzle executes the holding work of electronic component 150 again in response to the component holding error, the suction nozzle is imaged by camera 118. At this time, the presence or absence of electronic component 150 is determined based on the image data, and in a case where electronic component 150 is present, it is determined that the component holding error is released (S114: YES).

When stage 52 or the like moves again toward the command position in response to the axial movement error, the post-movement position of stage 52 or the like is calculated based on the output value of the encoder such as electromagnetic motors 38 of conveyance device 20. When determining the axial movement error caused by the re-movement of stage 52 or the like, as described above, it is determined whether the post-movement position of stage 52 or the like is located within a set range centered on the command position, for example, within a range of 0.1 mm. On the other hand, when it is re-determined whether an error has occurred after the re-movement of stage 52 or the like, it is determined whether the post-movement position of stage 52 or the like is located in a wider range than the set range centered on the command position, for example, within a range of 0.5 mm. In a case where the post-movement position of stage 52 or the like is located in a wider range than the set range centered on the command position, for example, within a range of 0.5 mm, it is determined that the axial movement error is released (S114: YES). As described above, when determining the first error, it is determined whether the work result satisfies the allowable value, and when determining the error of the work re-executed by the first error determination, that is, when determining the second error, it is determined whether the work result satisfies the allowable value wider than the previous allowable value. As a result, it is easy to release the error by the re-executed work.

When heater 78 is heated again in response to the temperature abnormality error, the temperature of heater 78 is measured by temperature sensor 79 of heater 78. When determining the temperature abnormality error caused by the reheating of heater 78, it is determined whether the temperature of heater 78 is within a set temperature range, for example, 100° C. to 105° C., as described above. On the other hand, when it is re-determined whether an error has occurred after reheating heater 78, it is determined whether the temperature of heater 78 is in a wider range than the set temperature range, for example, 97° C. to 108° C. In addition, when the ultraviolet curable resin and the metallic ink are heated again in ink jet heads 76 and 88 in response to the temperature abnormality error, the temperatures of the ultraviolet curable resin and the metallic ink are measured by temperature sensors 77 and 89. When determining the temperature abnormality error caused by the reheating of the ultraviolet curable resin, it is determined whether the temperature of the ultraviolet curable resin falls within a set temperature range, for example, 70° C. to 75° C., as described above. On the other hand, when it is re-determined whether an error has occurred after the ultraviolet curable resin is reheated, it is determined whether the temperature of the ultraviolet curable resin is in a wider range than the set temperature range, for example, 67° C. to 78° C. In addition, when determining the temperature abnormality error caused by the reheating of the metallic ink, it is determined whether the temperature of the metallic ink falls within a set temperature range, for example, 30° C. to 35° C., as described above. On the other hand, when it is re-determined whether an error has occurred after the metallic ink is reheated, it is determined whether the temperature of the metallic ink is in a wider range than the set temperature range, for example, 27° C. to 38° C. In a case where the temperatures of heater 78, the ultraviolet curable resin, and the metallic ink fall within a wider range than the set temperature range, it is determined that the temperature abnormality error is released (S114: YES). As described above, even when re-determining the error after the work is re-executed in response to the temperature abnormality error, it is determined whether the re-executed work satisfies an allowable value wider than the allowable value used in the first error determination.

When the flattening work of the ultraviolet curable resin by flattening device 90 is executed again in response to the time-out error, the time required for the flattening work by flattening device 90 is measured. When determining the time-out error caused by the re-execution of the flattening work by flattening device 90, it is determined whether the work time by flattening device 90 exceeds a set time, for example, 10 seconds, as described above. On the other hand, when it is re-determined whether an error has occurred after the re-execution of the work by flattening device 90, it is determined whether the work time by flattening device 90 exceeds the set time, for example, 50 seconds. In a case where the work time of flattening device 90 does not exceed the time longer than the set time, for example, 50 seconds, that is, 50 seconds or less, it is determined that the time-out error is released (S114: YES). As described above, even when re-determining the error after the work is re-executed in response to the time-out error, it is determined whether the re-executed work satisfies an allowable value wider than the allowable value used in the first error determination.

When it is determined that the error is released as a result of the re-determination (YES in S114), the error notification executed in S106 is released (S116). That is, the turning-off of the warning lamp, the stop of the warning sound, the non-display of the warning screen, and the like are executed. Subsequently, the type of error that has occurred and the fact that the error is released are stored in a memory (not illustrated) of controller 120 (S118). As a result, in a case where an error that has occurred when circuit forming device 10 is operating outside working hours is automatically released, the worker can recognize the content of the automatically released error afterward.

When it is determined that the error is not released as a result of the re-determination (S114: NO), the processing in S110 to S114 is repeated. In other words, the work causing the error is repeatedly executed. When the processing in S110 to S114 is repeated a set number of times and it is determined that the error is not released (S114: NO), the processing by present program 170 ends. In other words, circuit forming device 10 is stopped and maintained in a state where an error notification is performed.

In a case where the error that has occurred is not set to the automatic release error in S108 (S108: NO), that is, in a case where the error that has occurred is set to the non-release error, the processing by present program 170 also ends. In other words, circuit forming device 10 is stopped and maintained in a state where an error notification is performed. In a state where circuit forming device 10 is stopped and the error notification is performed, the worker manually stops the error notification, and the restart of the work causing the error is executed by the operation of the worker.

As described above, in circuit forming device 10, the error that may occur when the circuit is formed by circuit forming device 10 is set to either the automatic release error or the non-release error by the operation of the worker, and in a case where an error that is set to the automatic release error occurs, the error that has occurred is automatically released. As a result, for example, it is possible to suppress a long stop of circuit forming device 10 outside working hours, and to suppress the burden on the worker outside working hours. In other words, by the worker selecting an error to be automatically released, it is also possible to secure the formation of an appropriate circuit.

As illustrated in FIG. 2, program 170 incorporated in controller 120 is provided with setting section 180, determination section 182, notification section 184, re-execution section 186, re-determination section 188, release section 190, and storage section 192. Setting section 180 is a functional section for executing the processing of S100. Determination section 182 is a functional section for executing the processing of S102. Notification section 184 is a functional section for executing the processing of S106. Re-execution section 186 is a functional section for executing the processing of S110. Re-determination section 188 is a functional section for executing the processing of S112. Release section 190 is a functional section for executing the processing of S116. Storage section 192 is a functional section for executing the processing of S118.

In the above embodiment, circuit forming device 10 is an example of a circuit forming device. The ultraviolet curable resin is an example of a curable resin. Metallic ink 166 is an example of a conductive fluid. Setting section 180 is an example of a setting section. Determination section 182 is an example of a determination section. Re-execution section 186 is an example of a re-execution section. In addition, the step executed by setting section 180 is an example of a setting step. The step executed by determination section 182 is an example of a determination step. The step executed by notification section 184 is an example of a notification step. The step executed by re-execution section 186 is an example of a re-execution step. The step executed by re-determination section 188 is an example of a re-determination step. The step executed by release section 190 is an example of a release step. The step executed by storage section 192 is an example of a storage step.

The present disclosure is not limited to the above examples, and can be performed in various aspects with various modifications and improvements based on the knowledge of those skilled in the art. For example, in the above example, the automatic release error and the non-release error are set by the user operation on error setting screen 172, but the automatic release error and the non-release error may be set by default.

In the above example, the imaging conditions when the suction nozzle is re-imaged in a case where an image processing error occurs are the same as the imaging conditions when imaging that caused the generated image processing error, but may be different imaging conditions.

In the above example, the circuit is configured to include resin laminates 130, 140, 160, wirings 168, and electronic component 150, but the wiring may be further formed, the electronic component may be mounted, and the resin laminate may be laminated on the circuit.

In the above example, metallic ink 166 is heated by heater 78, but metallic ink 166 may be heated by irradiation with laser light or the like.

In the above example, metallic ink 166 is discharged by ink jet head 76, but metallic ink 166 may be transferred by a stamp or the like. In addition, metallic ink 166 may be printed by screen printing.

REFERENCE SIGNS LIST

10: circuit forming device, 170: metallic ink (conductive fluid), 180: setting section (setting step), 182: determination section (determination step), 184: notification section (notification step), 186: re-execution section (re-execution step), 188: re-determination section (re-determination step), 190: release section (release step), 192: storage section (storage step)

The invention claimed is:

1. A circuit forming method for forming a circuit with a curable resin and a conductive fluid, the method comprising:
   a setting step of setting errors that occur during a circuit forming work to an automatic release error and a non-release error for each type of error, the automatic release error being to be automatically released, and the non-release error being not to be automatically released;
   a determination step of determining whether an error has occurred in work when the circuit is formed, presence or absence of the error being determined based on whether the work when the circuit is formed satisfies an allowable value;
   a re-execution step of automatically re-executing work determined that the error has occurred in the determination step, in a case where the error of the work is set to the automatic release error in the setting step; and
   a re-determination step of, in a case where the work determined that the error has occurred in the determination step is automatically re-executed in the re-execution step, re-determining the presence or the absence of the error based on whether the re-executed work satisfies a second allowable value wider than the allowable value.

2. The circuit forming method according to claim 1, further comprising:
   a notification step of notifying an occurrence of the error, in a case where it is determined that the error has occurred in the determination step; and
   a release step of automatically releasing a notification by the notification step, in a case where the error is released by the work automatically re-executed in the re-execution step.

3. The circuit forming method according to claim 1, further comprising:
   a storage step of storing a type of the error and a fact that the error is released, in a case where the error is released by the work automatically re-executed in the re-execution step.

4. A circuit forming device that forms a circuit with a curable resin and a conductive fluid, the device comprising:

a setting section configured to set errors that occur during a circuit forming work to an automatic release error and a non-release error for each type of error, the automatic release error being to be automatically released, and the non-release error being not to be automatically released;

a determination section configured to determine whether an error has occurred in work when the circuit is formed, presence or absence of the error being determined based on whether the work when the circuit is formed satisfies an allowable value;

a re-execution section configured to automatically re-execute work determined that the error has occurred by the determination section, in a case where the error of the work is set to the automatic release error by the setting section; and a re-determination section configured to, in a case where the work determined that the error has occurred in the determination section is automatically re-executed in the re-execution section, re-determining the presence or the absence of the error based on whether the re-executed work satisfies a second allowable value wider than the allowable value.

\* \* \* \* \*